(12) United States Patent
Shin et al.

(10) Patent No.: US 6,583,052 B2
(45) Date of Patent: Jun. 24, 2003

(54) METHOD OF FABRICATING A SEMICONDUCTOR DEVICE HAVING REDUCED CONTACT RESISTANCE

(75) Inventors: Dong Suk Shin, Kyoungki-do (KR); Yong Sun Sohn, Kyoungki-do (KR)

(73) Assignee: Hynix Semiconductor Inc., Kyoungki-do ( * ) Notice: Subject to any disclaimer, the term of this patent is extended or adjusted under 35 U.S.C. 154(b) by 6 days.

(21) Appl. No.: 10/032,736

(22) Filed: Dec. 28, 2001

(65) Prior Publication Data

US 2003/0045039 A1 Mar. 6, 2003

(30) Foreign Application Priority Data

Sep. 5, 2001 (KR) ........................................ 2001-54513

(51) Int. Cl.[7] ......................................... H01L 21/4763
(52) U.S. Cl. .................. 438/630; 438/637; 438/638; 438/643; 438/649; 438/655; 438/664; 438/667; 438/683
(58) Field of Search ..................... 438/568, 581, 438/583, 618, 627–630, 637–640, 643–644, 648–651, 663–664, 667–668, 672, 675, 682–683

(56) References Cited

U.S. PATENT DOCUMENTS 5,182,234 A * 1/1993 Meyer ................. 148/DIG. 51
6,020,254 A * 2/2000 Taguwa ...................... 438/618
6,335,279 B2 * 1/2002 Jung et al. ................... 438/303

FOREIGN PATENT DOCUMENTS

| JP | 57128058 | 8/1982 |
| JP | 6318669 | 1/1988 |
| JP | 1260858 | 10/1989 |
| JP | 2-82639 | 3/1990 |
| JP | 2237026 | 9/1990 |
| JP | 3-16124 | 1/1991 |
| JP | 4320329 | 11/1992 |
| JP | 7254574 | 10/1995 |
| JP | 63-0115 | 1/1998 |
| JP | 1012723 | 1/1998 |

* cited by examiner

*Primary Examiner*—Wael Fahmy
*Assistant Examiner*—Thanh Nguyen
(74) *Attorney, Agent, or Firm*—Ladas & Parry

(57) ABSTRACT

A method of fabricating a semiconductor device having the steps of forming an isolation layer in a silicon substrate to define an active region and a device isolation region; forming a junction region in the active region of the silicon substrate; forming an interlayer dielectric layer on the silicon substrate; forming a contact hole exposing the junction region by selectively removing the interlayer dielectric layer; selectively removing an exposed portion of the junction region under the contact hole; sequentially forming a thin metal layer and a buffer layer on the resultant structure including over the selectively removed portion of the junction region; and forming a silicide layer in the selectively removed portion of the junction region by performing a heat treatment.

18 Claims, 3 Drawing Sheets

METHOD OF FABRICATING A SEMICONDUCTOR DEVICE HAVING REDUCED CONTACT RESISTANCE

BACKGROUND OF THE INVENTION

1. Field of the Invention

The present invention relates generally to a method of fabricating a semiconductor device and more particularly, to a method of forming a contact with reduced contact resistance by employing a silicide layer in the fabrication of the semiconductor device.

2. Description of the Prior Art

Recent attempts to improve the characteristics of semiconductor devices are directed to reducing contact resistance and surface resistance in the source/drain regions of CMOS. Silicide compounds, with titanium, cobalt or nickel constituents, are under consideration as materials having low resistivity and low contact resistance.

Such materials with low resistivity and low contact resistance also have the ability to selectively form a silicide layer on the source/drain regions only. A related process in the art is often called a self-aligned silicide process.

In general, the silicide process is performed as follows. A thin metal layer is deposited and then turned into a silicide layer having an intermediate phase via a first heat treatment. Next, the silicide layer is subjected to a selective wet etching, so that silicide material remains on the source/drain regions only. Subsequently, by carrying out a second heat treatment, the desired silicide thin layer is obtained.

Permitting a reduction in contact resistance between silicon and metal, the silicide process is mainly applied to high efficiency logic semiconductor devices. Contrary to that, since highly-integrated memory semiconductor devices can be utilized even with a relatively higher contact resistance, the typical silicide process is not applied thereto without alterations.

That is, instead of the typical silicide process allowing a selective formation of the silicide layer over all portions of the source/drain region, a selective etching process after silicidation is used to obtain a final form of the silicide layer. Silicidation as herein used is the process of depositing a silicide layer on a substrate or other feature of a semiconductor device.

Thus, the resultant silicide layer remains on certain portions only of the source/drain region, occupying a smaller area in comparison with the case of using the typical process. Therefore, the silicide layer in the memory devices cannot avoid some increases of contact resistance.

One silicide material that is often used is titanium silicide. The titanium silicide, for example, $TiSi_2$ with a C54 phase, has excellent properties, such as a low resistivity under 20 $\mu\Omega\cdot cm$, and a good thermal stability. The titanium silicide is formed with an intermediate phase of C49 having a relatively higher resistivity of between 60 and 90 $\mu\Omega\cdot cm$ at a heat treatment temperature under 650° C., and shifted in phase to a phase of C54 having a low resistivity at a temperature of between 700 and 900° C.

However, it is difficult to shift titanium silicide to the C54 phase in design requirements where the silicide layer is less than 0.25 microns. The reason is that a nucleation site of the C54 phase can not be secured in a narrow line or pattern. This peculiar feature is designated as line width effect.

In order to overcome the line width effect, new ways such as pre-amorphization implant (PAI) and addition of molybdenum as an impurity have been studied by those of skill in the art.

On the other hand, increasing complexity of integrated circuits results in increasing reduction of the line width of a device circuit. Necessarily, the area of the source/drain region is consequently rapidly decreased.

In relation to the above, a conventional method for fabricating a semiconductor device is described hereinafter with reference to FIGS. 1 to 3.

As shown in FIG. 1, a trench isolation layer 3 is formed in a portion of a semiconductor substrate 1 to define an active region and a device isolation region.

Next, an insulating layer for a gate oxide layer 5, a polysilicon layer for a gate electrode 7, and an oxide layer for a capping layer 9 are sequentially deposited on the active region of the semiconductor substrate 1, and then selectively patterned to form the gate oxide layer 5, the gate electrode 7 and the capping layer 9, as shown.

Thereafter, a gate spacer 11 is formed on the lateral sides of the gate oxide layer 5, the gate electrode 7 and the capping layer 9. By implanting appropriate impurities, a source and drain region 13 is formed in the semiconductor substrate 1 under each gate spacer 11. Here, before the gate spacer 11 is formed, a lightly doped impurity region is additionally formed in the semiconductor substrate 1.

Then, a diffusion barrier layer 15 is deposited over an entire resultant structure, and an interlayer dielectric layer 17 is deposited on the diffusion barrier layer 15.

Subsequently, the interlayer dielectric layer 17 and the diffusion barrier layer 15 are selectively removed to form a contact hole 19 exposing the source and drain regions 13. During the removal of the interlayer dielectric layer 17 and the diffusion barrier layer 15, the source and drain regions 13 in the semiconductor substrate 1 are overetched to a certain predetermined depth.

Next, as shown in FIG. 2, a titanium layer 21 is formed on the interlayer dielectric layer 17 including over all surfaces of the contact hole 19. A titanium nitride layer 23, serving as a buffer layer, is then formed over the titanium layer 21.

Thereafter, a heat treatment process is performed for silicidation. Referring to FIG. 3, a silicide layer 25 is formed on the source and drain regions 13 by means of silicidation between the titanium layer 21 in the overetched portion and an upper part of the source and drain regions 13.

The above-described conventional method has a drawback, which is described below. As the area of the source/drain region is decreased, the area of the silicide layer actually formed is accordingly also decreased. In addition, the reduction in area of the silicide layer gives rise to the increase of contact resistance during subsequent heat treatment processes.

SUMMARY OF THE INVENTION

It is therefore an object of the present invention to provide a method of fabricating a semiconductor device with reduced contact resistance, thus preventing a rapid increase of contact resistance by enlarging the actual area of a silicide layer.

This and other objects in accordance with the present invention are attained by a method for fabricating a semiconductor device, the method comprising the steps of providing a silicon substrate; forming an isolation layer in the silicon substrate to define an active region and a device isolation region; forming a junction region in the active region of the silicon substrate; forming an interlayer dielectric layer on the silicon substrate; forming a contact hole exposing the junction region by selectively removing the interlayer dielectric layer; selectively removing an exposed portion of the junction region under the contact hole; sequentially forming a metal thin layer and a buffer layer on a resultant structure including a selectively removed portion of the junction region; and forming a silicide layer in the selectively removed portion of the junction region by performing a heat treatment.

According to another aspect of the present invention, the present invention provides a method for fabricating a semiconductor device, comprising the steps of providing a silicon substrate; forming an isolation layer in the silicon substrate to define an active region and a device isolation region; sequentially forming a gate oxide layer and a gate electrode on the active region of the silicon substrate; forming a junction region in the silicon substrate under each lateral side of the gate electrode; sequentially forming an oxide layer and a nitride layer on the silicon substrate; forming a contact hole exposing the junction region by selectively removing the oxide layer and the nitride layer; selectively removing an exposed portion of the junction region under the contact hole in vertical and/or lateral directions by means of a wet etching or a dry etching; sequentially forming a metal thin layer and a buffer layer on a resultant structure including a selectively removed portion of the junction region; and allowing silicidation between the metal thin layer formed in the selectively removed portion of the junction region and an upper part of the junction region by performing a rapid thermal annealing.

DETAILED DESCRIPTION OF THE INVENTION

The present invention will be now described more fully hereinafter with reference to accompanying drawings, in which preferred embodiments of the invention are shown. This invention may, however, be embodied in other many different forms and should not be construed as limited to the embodiments set forth herein.

Figure 1:
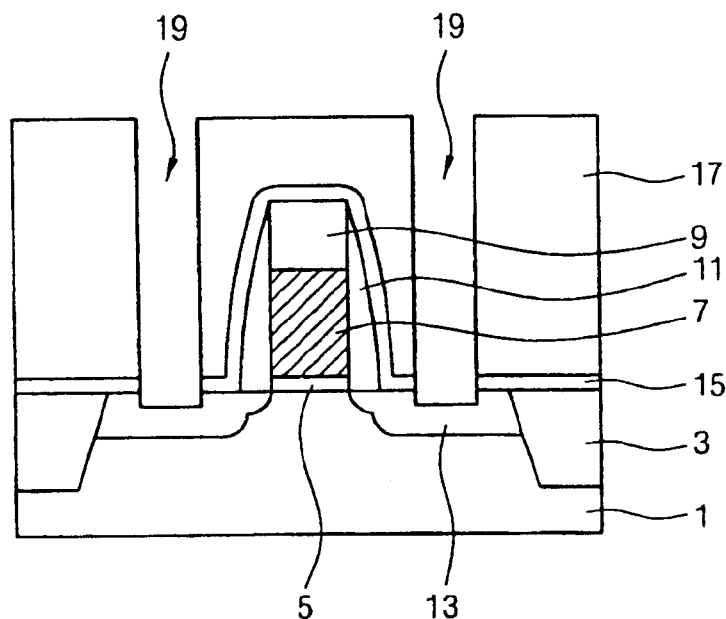
FIGS. 1 to 3 are cross-sectional views showing the steps of a conventional method of fabricating a semiconductor device.
Figure 2:
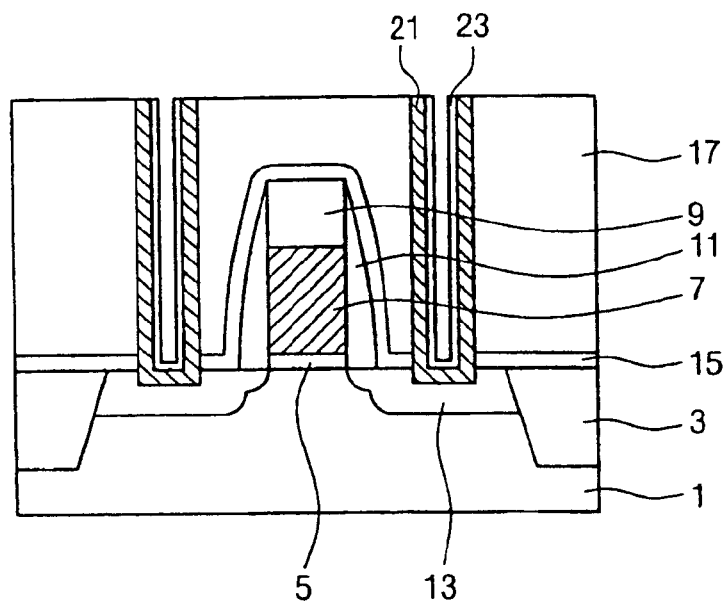
Figure 3:
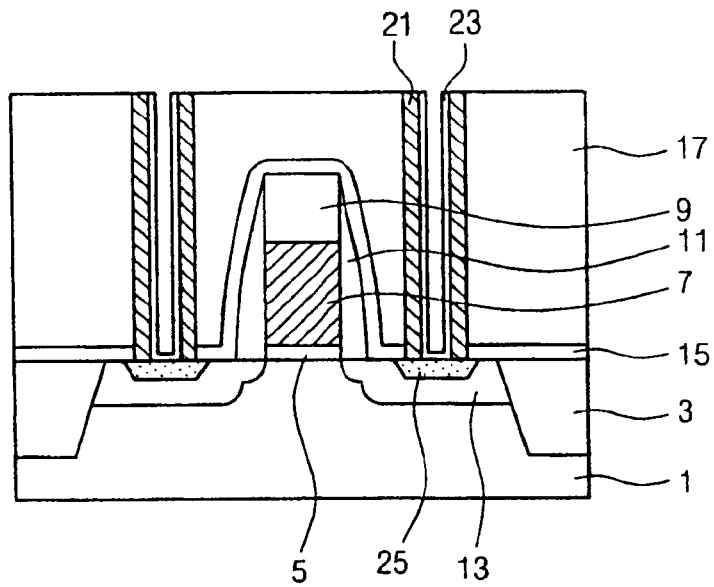
Figure 4:
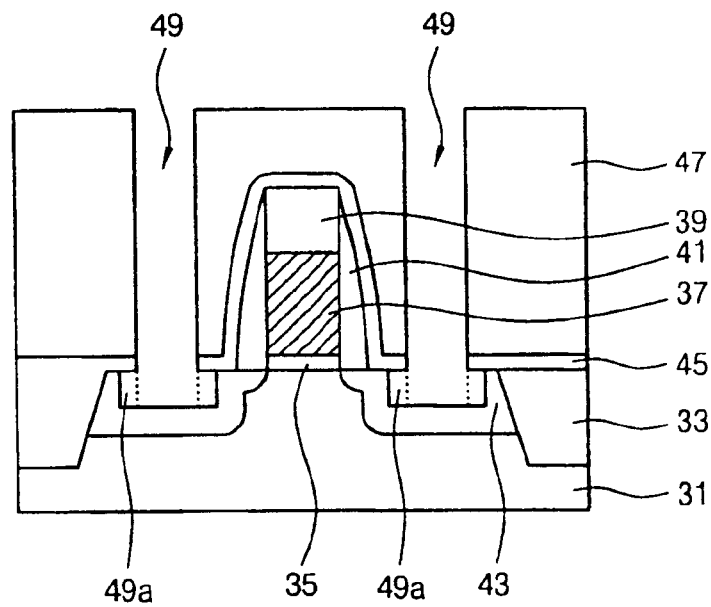
FIGS. 4 to 6 are cross-sectional views showing the steps of a method of fabricating a semiconductor device according to an embodiment of the present invention.
Figure 5:
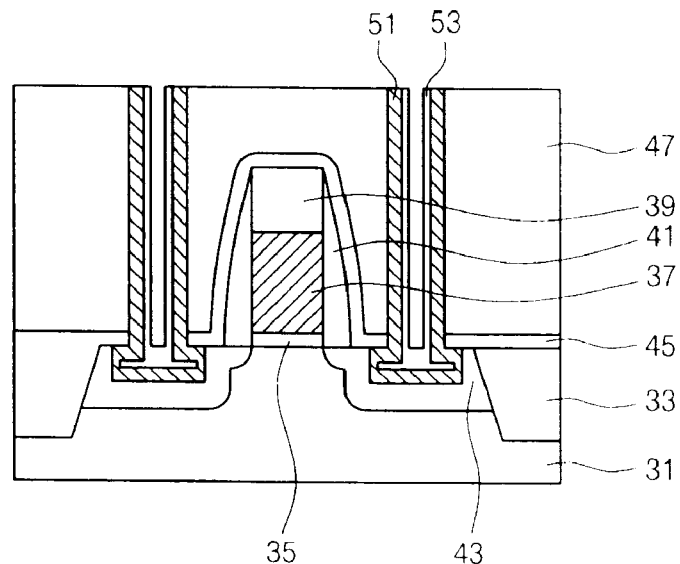
Figure 6:
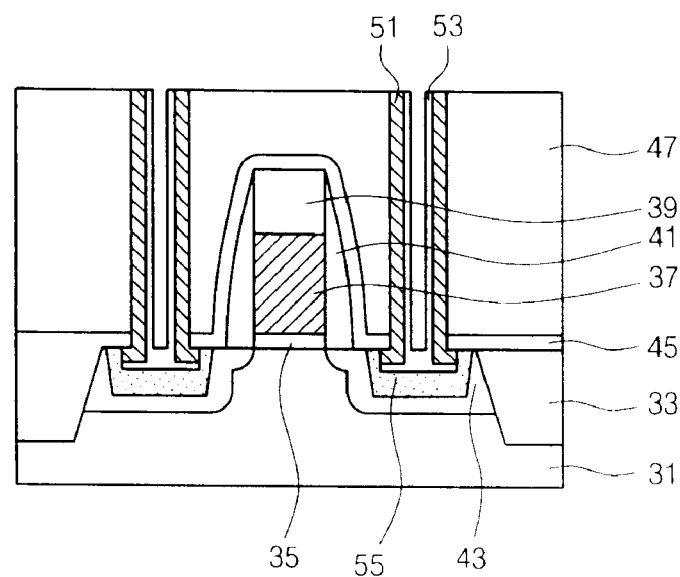

A method of fabricating a semiconductor device according to an embodiment of the present invention is illustrated in FIGS. 4 to 6. Referring to FIG. 4, after a silicon substrate 31 is provided, a trench isolation layer 33 is formed in a portion of the silicon substrate 31 to define an active region and a device isolation region.

Next, an insulating layer for a gate oxide layer 35, a polysilicon layer for a gate electrode 37, and an oxide layer for a capping layer 39 are deposited in sequence on the active region of the silicon substrate 31, and then selectively patterned to form the gate oxide layer 35, the gate electrode 37 and the capping layer 39.

Thereafter, a gate spacer 41 is formed on lateral sides of the gate oxide layer 35, the gate electrode 37 and the capping layer 39. Source and drain regions 43 are formed as junction regions by implanting appropriate impurities to a depth of between about 200 and about 2000 Å in the silicon substrate 31 under each gate spacer 41. Here, before the gate spacer 41 is formed, a lightly doped impurity region is additionally formed in the silicon substrate 31.

Then, a nitride layer 45 is deposited over the entire resultant structure, and an interlayer dielectric layer 47, such as an oxide layer, is deposited on the nitride layer 45. While the nitride layer 45 has a thickness of between about 100 and about 500 Å, the interlayer dielectric layer 47 has a thickness of between about 1000 and about 10000 Å.

Subsequently, the interlayer dielectric layer 47 and the nitride layer 45 are selectively removed to form a contact hole 49 exposing the source and drain regions 43. During the removal of the interlayer dielectric layer 47 and the nitride layer 45, the source and drain regions 43 in the silicon substrate 31 are overetched to a certain predetermined depth.

Next, a wet etching process or a dry etching process is additionally performed to a portion of the source and drain regions 43 exposed by the contact hole 49. As a result, an upper part of the source and drain regions 43 are partially removed to between about 100 and about 1000 Å in vertical and/or lateral directions. In the case of a wet etching process being used, the source and drain regions 43 may be laterally removed to a greater degree than is desirable. This undesirable phenomenon may cause the decrease of the impurity concentration earlier deposited. Therefore, there is a need for proper control of the laterally etching action during the wet etching process.

Preferably, employing an etching solution in which $NH_4F$, $H_2O_2$ and $H_2O$ are selectively mixed in a suitable ratio, the wet etching process continues for between about 10 and about 1000 seconds. Though the silicon substrate 31 underneath the contact hole 49 is laterally etched, the circumferential oxide and nitride layers are not etched.

Thereafter, as depicted in FIG. 5, a metal thin layer 51 is formed over all the surfaces of the interlayer dielectric layer 47 in the contact hole 49 and on the additionally removed portion of the source and drain regions 43 by means of physical vapor deposition (PVD) process or, preferably, a chemical vapor deposition (CVD) process. Then, a buffer layer 53 is formed over the metal thin layer 51 by using a CVD process.

Preferably, the metal thin layer 51 is deposited with a thickness of between about 50 and about 500 Å, selectively using titanium (Ti), cobalt (Co), nickel (Ni) or tungsten (W). Furthermore, the buffer layer 53 is deposited with a thickness of between about 500 and about 1000 Å, using titanium nitride (TiN), tungsten nitride (WN), tantalum (Ta), tantalum aluminum nitride (TaAlN) or tungsten boron nitride (WBN).

Thereafter, a heat treatment process, preferably a rapid thermal annealing process, is performed for silicidation. Referring to FIG. 6, a silicide layer 55 is formed on and in the source and drain regions 43 by means of silicidation between the thin metal layer 51, formed on an additionally etched portion of the source and drain regions 43, and an upper portion of the source and drain regions 43 contiguous to the metal thin layer 51. The rapid thermal annealing process is performed for about 10 and 600 seconds at a temperature of between 500 and 1000° C. under a nitrogen, argon or hydrogen ambient atmosphere.

Contrary to the prior art, a much broader portion of the silicon substrate 31 is exposed by means of an additional etching process. Thus, in forming the silicide layer, the silicidation reaction is performed over a much wider area.

Although it is not illustrated in the drawings, a diffusion barrier layer and an adhesion layer optionally may be formed on the entire structure on which the silicide layer is formed. The diffusion barrier layer is deposited with a thickness of about 50 to 500 Å by means of a CVD process or a PVD process. The diffusion barrier layer may comprise titanium nitride (TiN), tungsten nitride (WN), tantalum (Ta), tantalum aluminum nitride (TaAlN) and tungsten boron nitride (WBN) either used alone or together in a stack. The adhesion layer may use tungsten (W), cobalt (Co), nickel (Ni), tantalum (Ta) or copper (Cu).

As fully described hereinbefore, a method for fabricating a semiconductor device according to the present invention has at least the following advantages and effects.

By the method of the present invention, the silicidation area of the silicon substrate is actually increased since the area of the exposed portion of the silicon substrate is enlarged owing to the additional etching process. Accordingly, the contact resistance is reduced, and further, the undesirable increase of the contact resistance can be effectively prevented during subsequent heat treatment processes.

The method of the present invention can be advantageously applied to the fabrication of highly integrated semiconductor devices such as 1G DRAM, while remarkably reducing the contact resistance and thereby enhancing the operation efficiency of the devices. In addition, the method of the present invention can contribute permit simplification of the manufacturing processes, since no additional processes are required.

In the drawings and specification, there have been disclosed typical preferred embodiments of the invention. Although specific terms are employed, they are used in a generic and descriptive sense only and not for purposes of limitation, the scope of the invention being set forth in, and limited only by, the following claims.

What is claimed is:

1. A method of fabricating a semiconductor device having a silicon substrate having an active region and an isolation region, comprising the steps of:
   forming a junction region in the active region;
   forming an interlayer dielectric layer on the silicon substrate and over the junction region;
   forming a continuous contact hole exposing the junction region by selectively removing a portion of the interlayer dielectric layer and a portion of the junction region to form the continuous contact hole therethrough, wherein the size of the contact hole in the junction region is larger than the size of the contact hole in the interlayer dielectric layer;
   sequentially forming a thin metal layer and a buffer layer over the surfaces defining the contact hole; and
   forming a silicide layer in the selectively removed portion of the junction region by performing a heat treatment.

2. The method of claim 1, wherein the interlayer dielectric layer includes a nitride layer and an oxide layer.

3. The method of claim 1, wherein the step of forming a continuous contact hole further comprises the step of selectively removing the exposed portion of the contact hole in the junction region by utilizing a wet etching process or a dry etching process to allow a partial removal of the silicon substrate in vertical and lateral directions.

4. The method of claim 1, wherein the thin metal layer comprises a metal selected from the group consisting of titanium (Ti), cobalt (Co), nickel (Ni) and tungsten (W).

5. The method of claim 1, wherein the buffer layer comprises a metal selected from the group consisting of titanium nitride (TiN), tungsten nitride (WN), tantalum (Ta), tantalum aluminum nitride (TaAlN) and tungsten boron nitride (WBN).

6. The method of claim 1, wherein the heat treatment includes a rapid thermal annealing process.

7. The method of claim 6, wherein the rapid thermal annealing is performed for about 10 to 600 seconds at a temperature of between 500 and 1000° C. under a nitrogen, argon or hydrogen ambient atmosphere.

8. The method of claim 1, wherein the silicide layer is formed by means of silicidation between a portion of the thin metal layer formed on the surface area of the contact hole in the junction region and a portion of the junction region contiguous the thin metal layer.

9. The method of claim 3, wherein a dimension of the contact hole in the junction region is between 100 and 1000 Å in vertical and/or lateral directions.

10. The method of fabricating a semiconductor device having a silicon substrate having an active region and an isolation region, comprising the steps of:
    sequentially forming a gate oxide layer and a gate electrode on the active region of the silicon substrate;
    forming a junction region in the silicon substrate under each lateral side of the gate electrode;
    sequentially forming a nitride layer and an oxide layer on the silicon substrate;
    forming a continuous contact hole exposing the junction region by selectively removing a portion of the oxide layer, a portion of the nitride layer, and a portion of the junction region to form a continuous contact hole therethrough, wherein the size of the contact hole formed in the junction region is larger than the size of the contact hole formed in the oxide layer or the nitride layer;
    sequentially forming a thin metal layer and a buffer layer on the surfaces of the contact hole; and
    allowing silicidation between the thin metal layer, formed on the selectively removed portion of the junction region, and an upper portion of the junction region by performing a rapid thermal annealing process.

11. The method of claim 10, wherein the thin metal layer comprises a metal selected from the group consisting of titanium (Ti), cobalt (Co), nickel (Ni), and tungsten (W).

12. The method of claim 10, wherein the buffer layer comprises a metal selected from the group consisting of titanium nitride (TiN), tungsten nitride (WN), tantalum (Ta), tantalum aluminum nitride (TaAlN), and tungsten boron nitride (WBN).

13. The method of claim 10, wherein the rapid thermal annealing is performed for about 10 to about 600 seconds at a temperature of between 500 and 1000° C. under a nitrogen, argon or hydrogen ambient atmosphere.

14. The method of claim 10, wherein the thin metal layer and the buffer layer are formed by means of a chemical vapor deposition process.

15. The method of claim 10, wherein a dimension of the contact hole in the junction region is between 100 and 1000 Å in vertical and lateral directions.

16. The method of claim 10, wherein the nitride layer has a thickness of between about 100 and 500 Å, and the oxide layer has a thickness of about 1000 to 10000 Å.

17. The method of claim 10, wherein the thin metal layer has a thickness of between about 50 and 500 Å, and the buffer layer has a thickness of between about 500 and 1000 Å.

18. The method of claim 10, wherein the step of forming a continuous contact further comprises the step of selectively removing the exposed portion of the contact hole in the junction region by utilizing a wet etching process or a dry etching process.

* * * * *